(12) United States Patent
Pu et al.

(10) Patent No.: US 12,266,583 B2
(45) Date of Patent: Apr. 1, 2025

(54) FLIP CHIP PACKAGE UNIT AND ASSOCIATED PACKAGING METHOD

(71) Applicant: Chengdu Monolithic Power Systems Co., Ltd., Chengdu (CN)

(72) Inventors: Yingjiang Pu, Chengdu (CN); Hunt Hang Jiang, Saratoga, CA (US); Xiuhong Guo, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 298 days.

(21) Appl. No.: 17/712,323

(22) Filed: Apr. 4, 2022

(65) Prior Publication Data

US 2022/0344231 A1    Oct. 27, 2022

(30) Foreign Application Priority Data

Apr. 22, 2021 (CN) .......................... 202110435460.7

(51) Int. Cl.
| | |
|---|---|
| H01L 21/683 | (2006.01) |
| H01L 23/00 | (2006.01) |
| H01L 23/31 | (2006.01) |
| H01L 23/29 | (2006.01) |

(52) U.S. Cl.
CPC ...... *H01L 23/3164* (2013.01); *H01L 21/6836* (2013.01); *H01L 24/32* (2013.01); *H01L 24/73* (2013.01); *H01L 23/293* (2013.01); *H01L 24/13* (2013.01); *H01L 24/16* (2013.01); *H01L 24/29* (2013.01); *H01L 2221/68327* (2013.01); *H01L 2221/68381* (2013.01); *H01L 2224/13147* (2013.01); *H01L 2224/16225* (2013.01); *H01L 2224/2919* (2013.01); *H01L 2224/32057* (2013.01); *H01L 2224/32225* (2013.01); *H01L 2224/73204* (2013.01)

(58) Field of Classification Search
CPC .. H01L 23/3164; H01L 21/6836; H01L 24/73
See application file for complete search history.

(56) References Cited

U.S. PATENT DOCUMENTS

| | | | |
|---|---|---|---|
| 2016/0073490 A1* | 3/2016 | Branchevsky | H05K 1/0216 361/783 |
| 2017/0323868 A1* | 11/2017 | Park | H01L 23/3185 |

* cited by examiner

*Primary Examiner* — Dale E Page
*Assistant Examiner* — Wilner Jean Baptiste
(74) *Attorney, Agent, or Firm* — Perkins Coie LLP

(57) ABSTRACT

A flip chip package unit and associated packaging method. The flip chip package unit may include an integrated circuit ("IC") die having a plurality of metal pillars formed on its first surface and attached to a rewiring substrate with the first surface of the IC die facing to the rewiring substrate, an under-fill material filling gaps between the first surface of the IC die and the rewiring substrate, and a back protective film attached to a second surface of the IC die. The back protective film may have good UV sensitivity to change from non-solid to solid after UV irradiation while maintaining its viscosity with the IC die not reduced after UV irradiation. The back protective film may be uneasy to deform and to peel off from the IC die and can provide physical protection and effective heat dissipation path to the IC die.

12 Claims, 10 Drawing Sheets

FLIP CHIP PACKAGE UNIT AND ASSOCIATED PACKAGING METHOD

CROSS-REFERENCE TO RELATED APPLICATION(S)

This application claims the benefit of CN application No. 202110435460.7 filed on Apr. 22, 2021 and incorporated herein by reference.

TECHNICAL FIELD

This disclosure relates generally to semiconductor devices, and particularly but not exclusively relates to packaging structure for integrated circuit and associated packaging method.

BACKGROUND

One of the integrated circuit packaging methods includes flip chip packaging of semiconductor dies with integrated circuits (IC) formed therein/thereon. For IC dies that need to handle large power, thermal performance is one of the key design specifications that needs to be considered. Currently, flip-chip packaged IC dies are generally wrapped with traditional encapsulation materials such as molding compound. To meet the heat dissipation requirements to the IC dies, existing solution resort to removing the encapsulation materials on back surface of the IC dies. However, the risk of damage during storage or transportation is increased by exposing the back surface of the IC dies.

SUMMARY

In accordance with an embodiment of the present disclosure, a flip chip package unit is disclosed. The flip chip package unit may comprise an integrated circuit ("IC") die, having a first die surface and a second die surface opposite to the first die surface, and a plurality of metal pillars formed on the first die surface. The flip chip package unit may further include a rewiring substrate, having a first substrate surface and a second substrate surface opposite to the first substrate surface. The IC die may be attached to the rewiring substrate with the first die surface facing to the second substrate surface. The flip chip package unit may further comprise an under-fill material, filling gaps between the first die surface and the rewiring substrate. The flip chip package unit may further comprise a back protective film, attached to the second die surface of the IC die, the back protective film comprising one or more adhesive films.

In accordance with an embodiment of the present disclosure, a method for manufacturing a flip chip package unit is disclosed. The method may comprise: providing a tape adhesive at least comprising a tape base layer and an adhesive film layer, wherein the adhesive film layer has a first adhesive surface and a second adhesive surface opposite to the first adhesive surface. Then, a hollow supporting frame may be installed on the tape base layer to frame the adhesive film layer in a hollow part of the hollow supporting frame. The method may further comprise mounting a wafer on the second adhesive surface of the adhesive film layer with a back surface of the wafer attached to the second adhesive surface, wherein the wafer includes a plurality of integrated circuit ("IC") units formed in/on the wafer and a plurality of metal pillars formed on a top surface of the wafer for each one of the plurality of IC units. The method may further comprise vertically cutting the wafer from its top surface along preset boundaries of each IC unit until cutting into the tape base layer at a predetermined depth to singulate the plurality of IC units from each other. After the cutting, each individualized IC unit becomes an IC die having a first die surface with the plurality of metal pillars on the first die surface and a second die surface attached to the adhesive film layer. The method may further comprise irradiating the adhesive film layer with ultraviolet ("UV") light passing through the tape base layer, and picking up each IC die with the adhesive film layer adhered to its second die surface and used as a back protective layer of each IC die.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
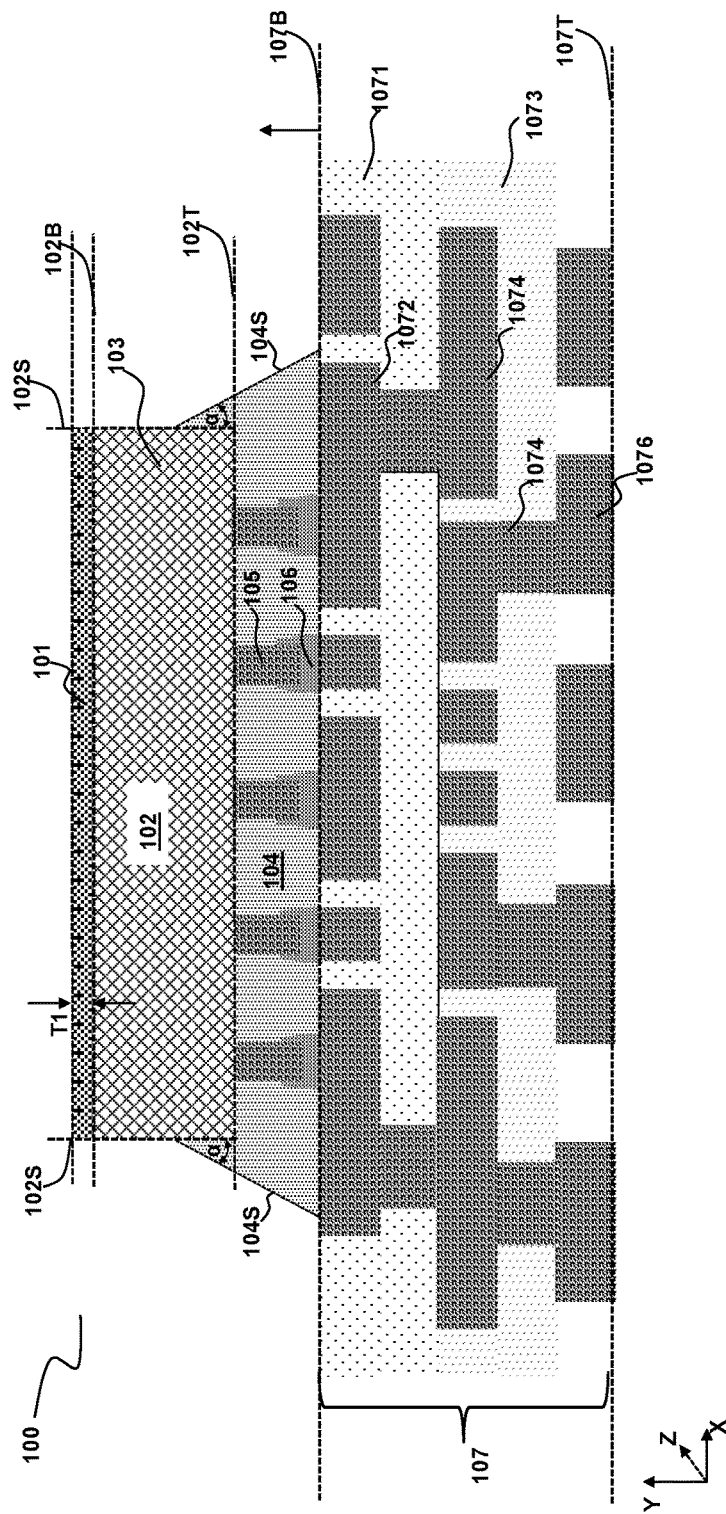
FIG. 1 illustrates a cross-sectional view of a portion of a flip chip package unit 100 in accordance with an embodiment of the present invention.

FIG. 1 illustrates a cross-sectional view of a portion of a flip chip package unit 100 in accordance with an embodiment of the present invention. The cross-section in FIG. 1 may be considered as a partial cross-sectional view as taken from the X-Y plane defined by the X and Y axis in a coordinate defined by X, Y and Z axis perpendicular to each other. In the exemplary embodiment of FIG. 1, the flip chip package unit 100 may comprise at least one IC die 102 packaged therein. In the example of FIG. 1 it is exemplarily illustrated that the flip chip package unit 100 includes one IC die 102. Those skilled in the art should understand that, in other embodiments, the flip chip package unit 100 may include two or more IC dies 102. The number and arrangement pattern or stacking fashion of the IC dies 102 packaged in different flip chip package units 100 can be different. The size of each IC die 102 and the circuit functions implemented can be the same or different, depending on the specific circuit functions to be implemented by a single flip chip package unit 100.

Each IC die 102 may comprise a substrate 103 on or in which integrated circuits are fabricated. Those skilled in the art should understand that the substrate 103 may comprise substrate formed of semiconductor materials such as silicon (Si), compound semiconductor materials such as silicon germanium (SiGe), or other forms of substrates such as silicon-on-insulator (SOI). Each IC die 102 may have a first surface, for instance referred to as a top surface (labeled with 102T in FIG. 1), and a second surface opposite to the top surface 102T. The second surface may be referred to as a back surface (labeled with 102B in FIG. 1). A plurality of metal pillars (e.g. copper pillars) 105 may be formed on the first surface 102T and may be used to lead out connections/terminals (for instance coupled to active areas including source/emitter regions, drain/collector regions and gate/base regions of transistors etc.) of the integrated circuit(s) fabricated on or in the substrate 103, so that these integrated circuit(s) may be connected or coupled to circuits outside the IC die 102. Each IC die 102 may be referred to as a flip chip die that may be attached (e.g. soldered/welded) to a substrate board or a PCB board with the top surface 102T facing down to interface with the substrate board or the PCB board, and thus may allow electrical coupling and/or signal communication with other external circuits on the substrate board or the PCB board.

In accordance with an exemplary embodiment, the flip chip package unit 100 may further comprise a rewiring substrate 107 having a first surface 107T and a second surface 107B opposite to the first surface 107T. Each IC die 102 may be attached to (e.g. soldered to or welded to) the rewiring substrate 107 with the top surface 102T of each IC die 102 facing to the second surface 107B of the rewiring substrate 107. For instance, the plurality of metal pillars 105 of each IC die 102 may be soldered to the second surface 107B of the rewiring substrate 107 through solder paste 106 to allow the IC die 102 to be electrically coupled to external circuits or for signal communication. The rewiring substrate 107 may comprise one or more interlayer dielectric layer(s) and one or more redistribution metal layer(s). For example, referring to the example illustrated in FIG. 1, the rewiring substrate 107 may include at least one redistribution metal layer (e.g. a first redistribution metal layer 1072 shown in FIG. 1) corresponding to each IC die 102 and coupled to the plurality of metal pillars 105 of each IC die 102. In the example of FIG. 1, the at least one redistribution metal layer may include the first redistribution metal layer 107 that passes/extends through a first interlayer dielectric layer 1071 and is electrically connected to the plurality of metal pillars 105. In some embodiments, the at least one redistribution metal layer may further include, for example, a second redistribution metal layer 1074, which passes/extends through a second interlayer dielectric layer 1073 to electrically connect to the first redistribution metal layer 1072. In some embodiments, the at least one redistribution metal layer may further include, for example, a third redistribution metal layer 1076 electrically connected to the second redistribution metal layer 1074. Those skilled in the art should understand that the first interlayer dielectric layer 1081, the first interlayer dielectric layer 1071 and the second interlayer dielectric layer 1073 may include the same dielectric material, or may include different dielectric materials. The rewiring substrate 107 described here is just for example and not intended to be limiting.

In accordance with an exemplary embodiment, an under-fill material 104 may be applied to fill gaps between the first surface 102T of each IC die 102 and the rewiring substrate 107. The under-fill material 104 may use insulating materials having higher fluidity, filling performance and stability than traditional plastic packaging materials (e.g. epoxy molding plastics, etc.), such as NAMICS 8410-302, LOCTITE ECCOBOND UF 8830S, etc. In one embodiment, the under-fill material 104 may only fill the gaps between the plurality of metal pillars (e.g., copper columns) 105 (including corresponding solder pastes 106) on the first surface 102T of each IC die 102 to protect the plurality of metal pillars 105. In one embodiment, the under-fill material 104 may further climb vertically to cover/surround a portion of the sidewalls 102S of each IC die 102. Vertically refers to the direction parallel to the Y-axis. Therefore, a large portion of the sidewalls 102S of each IC die 102 and its second surface 102B remain not wrapped/covered by the under-fill material 104, thereby contributing to better heat dissipation. In one embodiment, the under-fill material 104 protrudes outwards in a ladder shape from each sidewall 102S of each IC die 102, and a side surface 104S of the under-fill material 104 intersects with each sidewall 102S of each IC die 102 to form an angle α. In one embodiment, the angle α may be greater than 0 degrees and smaller than 90 degrees. In one embodiment, the angle α may be greater than 0 degrees and smaller than 45 degrees. In one embodiment, the angle α may be greater than 0 degrees and smaller than or equal to 30 degrees. In this way, the under-fill material 104 can not only better protect the plurality of metal pillars 105, but also better grasp and hold each IC die 102.

In accordance with an exemplary embodiment, a back protective film 101 may be attached to the second surface 102B of each exposed IC die 102. The back protective film 101 may include one or more adhesive films with good ductility/extensibility, adhesion/viscosity and UV sensitivity. For example, the ductility/extensibility of the back protective film 101 may be similar to or identical to that of gold (Au), and/or silver (Ag), and/or aluminum (Al), and/or copper (Cu), and/or other metal materials similar to Au, Ag, Al, or Cu. In an example, the adhesion/viscosity of the back protective film 101 may be in a range from 100 Pa·s to 3000 Pa·s at room temperature (e.g. at 25 degree centigrade). In an alternative example, the adhesion/viscosity of the back protective film 101 may be in a range from 500 Pa·s to 2500 Pa·s at room temperature (e.g. at 25 degree centigrade). In still an alternative example, the adhesion/viscosity of the back protective film 101 may be in a range from 1000 Pa·s to 2500 Pa·s at room temperature (e.g. at 25 degree centigrade). A first surface S1 of the back protective film 101 may be in direct contact and bonded with the second surface 102B of each IC die 102. The back protective film 101 may be mainly used to physically protect the back surface 102B of each IC die 102 from damage, static electricity, moisture, etc. Therefore, the back protective film 101 may advantageously prevent each IC die 102 in the flip chip package unit 100 from being damaged in later processes such as chip testing, chip grasping, and installing on PCB board etc. No other material layer is formed on a second surface S2 opposite to the first surface S1 of the back protective film 101. According to an embodiment of the present disclosure, UV sensitivity means that characteristics of the back protective film 101 may change before and after UV irradiation (for example by a UV light source of 10 mJ/cm$^2$-5000 mJ/cm$^2$), for example, from non-solid (before UV irradiation) to solid (after UV irradiation) while its viscosity with the IC die(s) 102 will not be reduced, and this change is irreversible. According to an embodiment of the present disclosure, the back protective film 101 may have a thickness T1 which may be greater than zero and thinner than 100 μm. For example, in one embodiment, the thickness T1 may be in a range from 20 μm to 100 μm. In one embodiment, the thickness T1 may be in a range from 25 μm to 80 μm. In one embodiment, the thickness T1 may be in a range from 25 μm to 50 μm. According to an embodiment of the present disclosure, the back protective film 101 may have a thermal conductivity in the range of 0.5 W/(m·K) to 10 W/(m·K). In one embodiment, the thermal conductivity of the back protective film 101 may be in the range of 0.5 W/(m·K) to 2 W/(m·K). The back protective film 101 should have characteristics such as coefficient of thermal expansion (CTE), shrinkage rate, elastic modulus and other characteristic parameters matching with those of materials of the second surface 102б of each IC die 102. The so-called matching may refer to that warpage caused by shrinkage and deformation between the back protective film 101 and each IC die 102 is within an allowable range by practical application requirements after subsequent process steps such as UV irradiation, baking and etc. In the example of FIG. 1, the material of the second surface 102б of each IC die 102 is actually the same as that of the substrate 103 of each IC die 102. For instance, the material of the second surface 102б of each IC die 102 may generally comprising semiconductor materials such as silicon (Si), germanium (Ge) and/or compound semiconductor materials such as germanium silicon (SiGe), silicon carbide (SiC), gallium nitride (GaN), silicon germanium (SiGe) etc. According to an embodiment of the present disclosure, the coefficient of thermal expansion (CTE) of the back protective film 101 may be in a range of 5-200, and in one example, its CTE may be 34. According to an embodiment of the present disclosure, the shrinkage rate of the back protective film 101 may be in a range of 0.1%-0.6%, and in one example, the shrinkage may be 0.28%. The back protective film 101 may further have a non-hygroscopic property, and its moisture sensitivity level is level I (or of lowest moisture sensitivity level). The back protective film 101 may adopt any suitable adhesive film that can meet the above characteristics requirements and protect the back surface 102B of the IC die 102. The back protective film 101 can fit well with the back surface 102B of the IC die 102, and is not easy to deform and fall off from the IC die 102 after UV curing. For example, adhesive films that are traditionally used to attach non flip chip dies to substrate or PCB but can meet the above characteristic requirements by the back protective film 101 may be used as the back protective film 101 of the flip chip IC die 102 mentioned in various embodiments of the present disclosure.

Non flip chip die refers to a die with integrated circuits active areas (such as source/emitter regions, drain/collector regions and gate/base regions of transistors etc.) formed on a top side of the die, and when mounted on/to a substrate or PCB board, a back surface of the non-flip chip die is attached to the substrate or PCB board while a top surface of the die is facing up and its active areas are connected to the substrate or PCB board through metal bonding wires.

In accordance with an exemplary embodiment, the back protective film 101 may use a prefabricated tape adhesive 201, such as Adwill LC2824H manufactured by Lintec Corporation, wafer protection film WP-571E-P manufactured by Nitto Corporation, Japan, and so on, that are currently available on the market. This kind of tape adhesive may usually include a tape base layer and an adhesive film layer. The adhesive film layer of the tape adhesive 201 may be directly attached to the second surface 102B of the IC die 102, and the tape base layer may be separated from the adhesive film layer in subsequent process steps so that the adhesive film layer is left to be attached to the back surface 102B of the IC die 102 as the back protective film 101. Therefore, the back protective film 101 is quite different from traditional molding compound (e.g. plastic molding compound, resin molding compound etc.) or epoxy, and its thickness T1 may generally be smaller than 100 μm. The back protective film 101 may be able to meet the requirements of die backside or back surface protection and IC die heat dissipation at the same time. On the contrary, the traditional packaging materials (such as molding compound or epoxy) need to adopt the process of pressure over molding, and thus the packaging materials wrap and fill all the spaces surrounding of the IC die 102 and wrap the entire back surface 102B of the IC die 102 after the molding process. Moreover, toughness and pliability of the traditional packaging materials are generally poor, and thickness of the traditional packaging materials covering the back surface 102B of the IC die 102 usually needs to be greater than 100 μm to reduce the probability of cracking (usually if the thickness is less than 100 μm, it is very likely to cause cracking of the traditional packaging materials, leading to die cracking and other quality and reliability problems). However, thicker packaging materials covering the back surface 102B result in poor heat dissipation performance of the IC die 102 that is unable to meet application requirements. As mentioned in the background descriptions, in order to meet the demand for heat dissipation performance of high power IC dies/chips, it is necessary to remove the traditional packaging materials on the back surface of the die/chip, but resulting in the exposed die/chip back surface vulnerable to damages and the process cost increased. Therefore, without using the back protective film 101 and associated manufacturing process according to various embodiments of the present invention, it is difficult to meet the requirements of reliability, die/chip protection and heat dissipation at the same time.

FIG. 2A to FIG. 2I illustrate partial cross-sectional views of some process stages of a wafer level packaging method for manufacturing a flip chip package unit (for example, the flip chip package unit 100 mentioned in the above described embodiments with reference to FIG. 1) in accordance with an embodiment of the present invention.

Figure 2A:
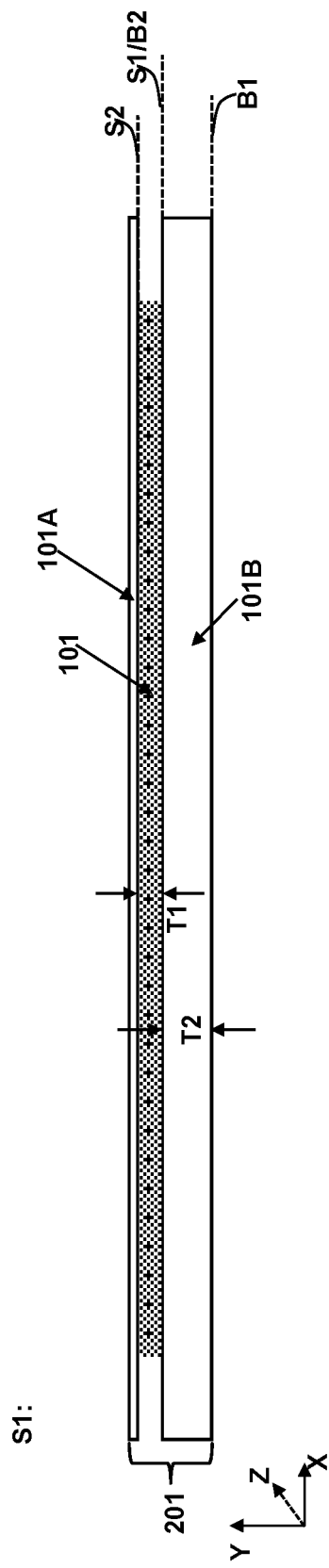
FIG. 2A to FIG. 2I illustrate partial cross-sectional views of some process stages of a wafer level packaging method for manufacturing a flip chip package unit in accordance with an embodiment of the present invention.

Referring to the cross sectional view illustrated in FIG. 2A, in step S1, a tape adhesive 201 may be provided. In the example of FIG. 2A, it is exemplarily illustrated that the tape adhesive 201 includes a tape base layer 101B, an adhesive film layer 101 and a tape coating layer 101A, which are usually sold in rolls. The tape base layer 101B may also be generally referred to as the tape carrier layer, which has a first base layer surface B1 and a second base layer surface B2 opposite to the first base layer surface B1. The tape base layer 101B is mainly used to provide support in subsequent cutting process steps. According to an embodiment of the present disclosure, the tape base layer 101B has strong UV transmittance (that is, UV light can easily pass through the tape base layer 101B), and its thickness T2 is in a range from 50 μm to 300 μm (for example, in one example, its thickness is 100 μm). The tape base layer 101B may also have good pliability, it will not leak water and has a strong carrying capacity after being half cutting (so-called half cutting refers to cutting into the tape base layer 101B at a depth h smaller than its thickness T2 as will be described in step 2D below). The adhesive film layer 101 has a first adhesive surface S1 and a second adhesive surface S2 opposite to the first adhesive surface S1, and may be formed on the second base layer surface B2 of the tape base layer 101B, and the first adhesive surface S1 is bonded with the second base layer surface B2. The adhesive film layer 101 has good ductility/extensibility, adhesion/viscosity and UV sensitivity. It may include one or more adhesive film layers having thermal expansion coefficient (CTE), shrinkage rate, elastic modulus and other characteristic parameters matching those of materials of the back surface of wafer 203 mentioned in the following step S3. Materials of the back surface of wafer 203 may include for example semiconductor materials such as silicon (Si), germanium (Ge) and/or compound semiconductor materials such as germanium silicon (SiGe), silicon carbide (SiC) and gallium nitride (GaN) etc. The so-called matching may refer to that warpage caused by shrinkage and deformation between the adhesive film layer 101 and the wafer 203 after subsequent process steps is within an allowable range by practical application requirements after subsequent process steps such as UV irradiation, baking and etc. UV sensitivity of the adhesive film layer 101 may refer to that characteristics/properties of the adhesive film layer 101 may change before and after UV irradiation, for example, changing from non-solid (before UV irradiation) to solid (after UV irradiation) with rapid decrease in viscosity with the tape base layer 101B after UV irradiation and non-decrease in viscosity with the wafer 203, and this change is irreversible. According to one exemplary embodiment of the present disclosure, the adhesive film layer 101 may have a thermal conductivity in the range of 0.5 W/(m·K) to 10 W/(m·K). In one embodiment, the thermal conductivity of the adhesive film layer 101 may be in the range of 0.5 W/(m·K) to 2 W/(m·K). According to one exemplary embodiment of the present disclosure, the adhesive film layer 101 may have a coefficient of thermal expansion (CTE) in a range of 5-200, and in one example, its CTE may be 34. In one example, the shrinkage of the adhesive film layer 101 may be in a range of 0.1%-0.6%, and in one example, the shrinkage may be 0.28%. In one embodiment, the adhesive film layer 101 may further have a non-hygroscopic property, with a moisture sensitivity of level I (or of lowest moisture sensitivity level). According to an example of the present disclosure, the thickness T1 of the adhesive film layer 101 is less than 100 μm, for example, in one embodiment, the thickness T1 may be in a range from 20 μm to 100 μm. In one embodiment, the thickness T1 of the adhesive film layer 101 may be in a range from 25 μm to 80 μm. In one embodiment, the thickness T1 of the adhesive film layer 101 may be in a range from 25 μm to 50 μm. The tape coating layer 101A is an optional layer with UV light resistance and is mainly used to protect the adhesive film layer 101 from being damaged, contaminated, UV radiated during storage, etc. The tape coating layer 101A may further serve to isolate the first base layer surface B1 of the tape base layer 101B from the second adhesive surface S2 of the adhesive film layer 101 when the tape adhesive 201 is rolled up, so that the tape adhesive 201 is easy to unfold during use, and the first base layer surface B1 of the tape base layer 101B and the second adhesive surface S2 of the adhesive film layer 101 described in the unfolding process will not stick and be easy to tear apart.

Figure 2B:
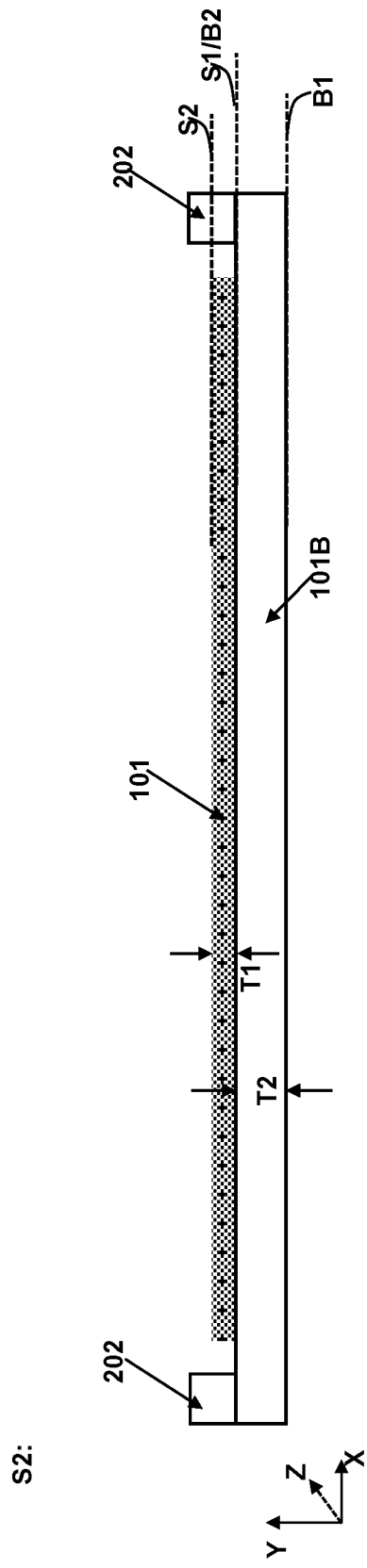

Next, referring to the cross sectional view illustrated in FIG. 2B, in step S2, removing the tape coating layer 101A (there is no need to perform this step in the example in which the tape adhesive 201 does not include the tape coating layer 101A) and install a supporting frame 202 on the tape base layer 101B. The supporting frame 202 is hollow, and since FIG. 2B illustrates the cross-sectional view on the X-Y plane, the cross-sectional cutting surfaces of the frame 202 are shown on the left and right sides of FIG. 2B. One of ordinary skill in the art would understand that the supporting frame 202 may have a planar view on the X-Z plane of a hollow ring with geometric shapes such as a rectangle or polygon or a circle. The adhesive film layer 101 is framed in the hollow part of the supporting frame 202.

Figure 2C:
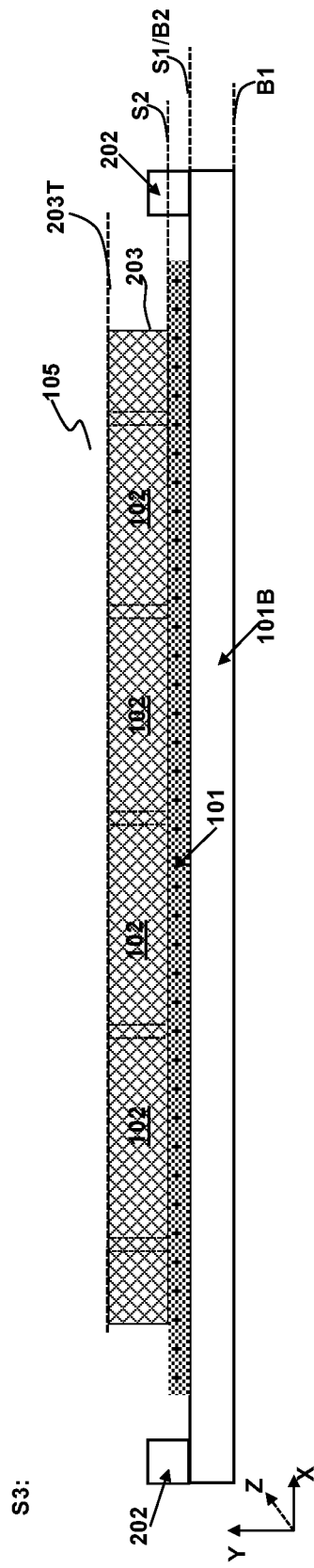

Next, referring to FIG. 2C, in step S3, a wafer 203 with a plurality of integrated circuit units 102 fabricated therein/thereon may be mounted on the second adhesive surface S2 of the adhesive film layer 101, so that a back surface 203B of the wafer 203 is attached to the second adhesive surface S2 of the adhesive film layer 101. For example, the attaching process of the wafer 203 to the second adhesive surface S2 of the adhesive film layer 101 may be performed at a pressure of about 0.3 MPa and a speed of 10 mm/s-50 mm/s under a temperature in the range of 50° C. to 90° C. (or 65° C. to 75° C.). One of ordinary skill in the art should understand that the shape and size of the adhesive film layer 101 may be reasonably prefabricated according to the shape, size and number and other parameters of the wafer 203 and this invention is not intended to be limiting in these aspects. In the example in FIG. 2A, the boundaries between the IC units 102 are represented with dashed lines. A plurality of metal pillars (such as copper pillars) 105 for each IC unit 102 may be fabricated on a top surface 203T (opposite to the back surface 203B) of the wafer 203. Generally, the entire mounted wafer 203 may subsequently be baked to enforce the attachment of the second adhesive surface S2 of the adhesive film layer 101 to the back surface 203B of the wafer 203. In an example, the baking temperature may range from 60° C. to 100° C. In another example, the baking temperature may range from 75° C. to 100° C. In yet another example, the baking temperature may be adjusted to 80° C. In an embodiment, the entire mounted wafer 203 may be baked during a baking time ranging from 1 hour to 2 hours.

Figure 2D:
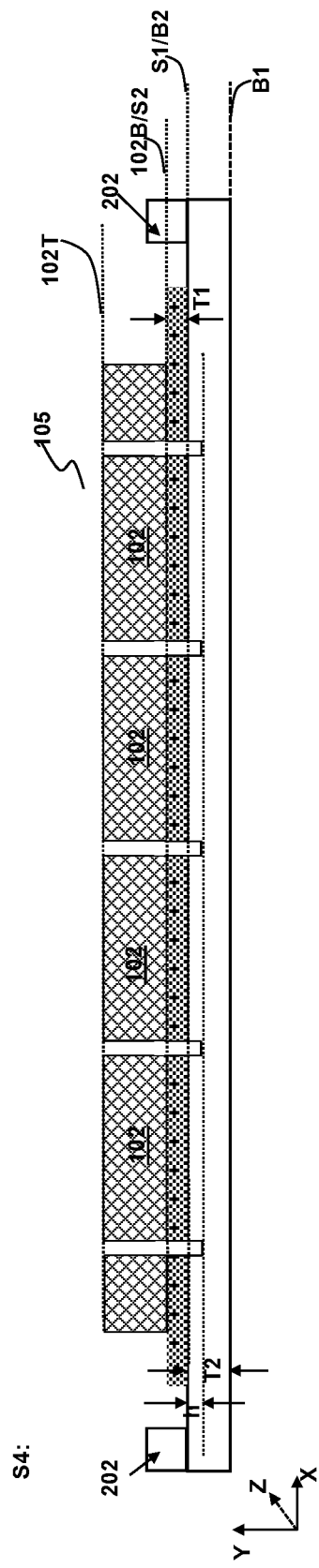

Next, referring to the illustration of FIG. 2D, in step S4, cutting the wafer 203 from the top surface 203T along the preset boundaries of each IC unit 102 vertically (parallel to the Y-axis) until cutting into the tape base layer 101B at a predetermined depth h, to singulate or separate the IC units 102 from each other. Consequently, a plurality of singulated or individualized IC dies 102 are obtained after the cutting process, with each IC die 102 having a plurality of metal pillars (such as copper pillars) 105 fabricated on its first surface 102T (which may also be referred to as a top surface of the die). Each IC die 102 may include a flip chip die. Each IC die 102 may further have a second surface 102B (that may also be referred to as a back surface of the die) opposite to its first surface 102T. The predetermined depth h may be smaller than the thickness T2 of the tape base layer 101B, i.e., h<T2. In one example, the predetermined depth h may be in a range of ⅓ to ½ of the thickness T2 of the tape base layer 101B, i.e., T2/3≤h≤T2/2.

Figure 2E:
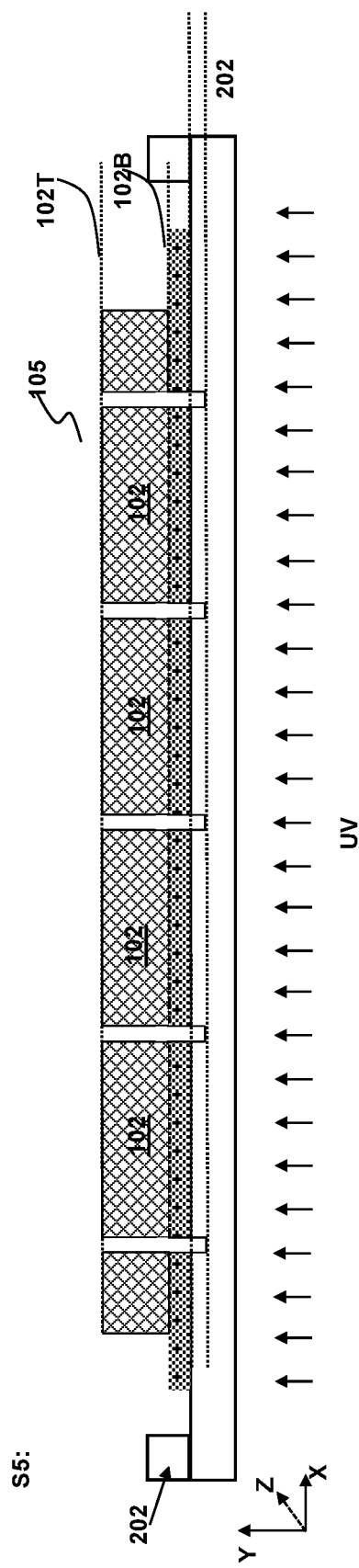

Next, referring to the illustration of FIG. 2E, in step S5, irradiating the adhesive film layer 101 with ultraviolet (UV) light from the first base layer surface B1 of the tape base layer 101B so that the adhesive film layer 101 solidifies with the viscosity with the IC dies 102 unchanged and the viscosity with the tape base layer 101B rapidly decreased after UV irradiation. For example, a UV light source of 50 mJ/cm²-5000 mJ/cm² may be used for irradiation. In one example, a UV light source of 300 mJ/cm²-3000 mJ/cm² could be used for irradiation. In another example, a UV light source of 300 mJ/cm²-1000 mJ/cm² could be used for irradiation. According to one embodiment of the present disclosure, a duration of irradiating the adhesive film layer 101 with UV light (also referred to as an UV irradiation duration) may be in the range of 30 seconds to 5 minutes. In one example, the UV irradiation duration may be around a minute to two minutes long.

Figure 2F:
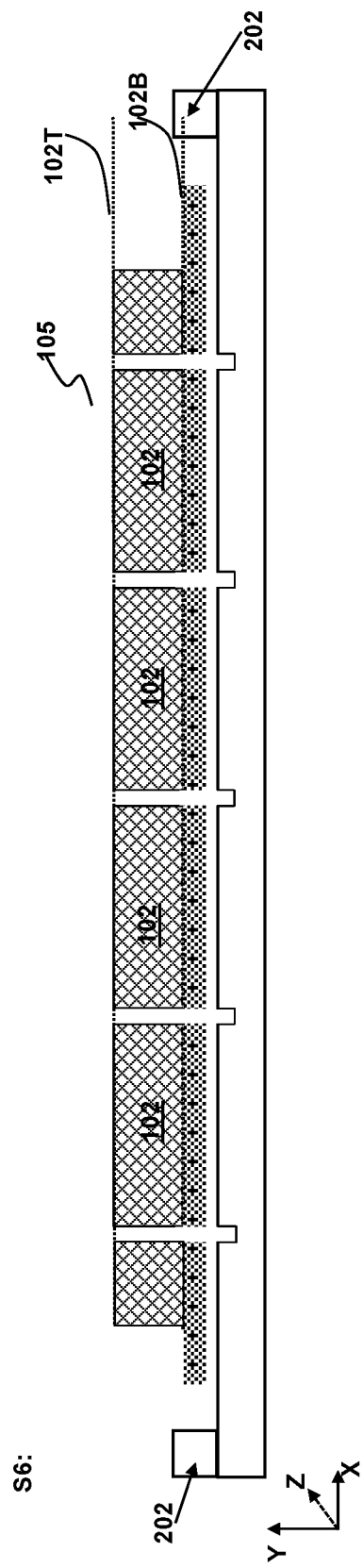

Next referring to FIG. 2F, in step S6, after UV irradiation, the adhesion between the adhesive film layer 101 and IC dies 102 remains good, but the adhesion between the adhesive film layer 101 and the tape base layer 101B decreased rapidly (i.e. the adhesion weakens sharply) and thus it becomes easy to separate the tape base layer 101B from the adhesive film layer 101. Consequently, each IC die 102 together with the adhesive film layer 101 which is adhered to its second surface (back surface) 102B may be easily picked up. Up to this point, singulated/individualized flip chip IC dies 102 have been fabricated. The adhesive film layer 101 is then used as the back protective layer 101 of each IC die 102 as described in the example of FIG. 1. That is, after the step S6, each flip chip IC die 102 may have a back protective layer 101 on its second surface (back surface) 102B, for providing physical protection, damage protection, anti-static electricity shields, moisture isolation, etc., while meeting the heat dissipation requirements of the IC die 102.

Figure 2G:
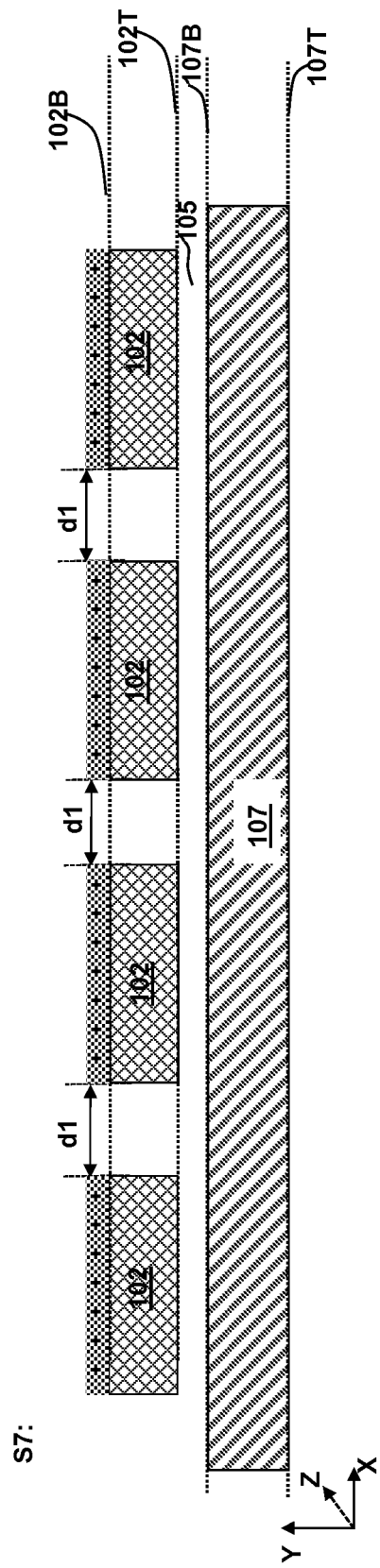

Next referring to FIG. 2G, in step S7, providing a rewiring substrate 107, which has a first substrate surface 107T and a second substrate surface 107B opposite to the first substrate surface 107T, and attaching (e.g. by soldering or welding) each IC die 102 to the rewiring substrate 107 with the first surface (top surface) 102T of each IC die 102 facing to the second substrate surface 107B of the rewiring substrate 107. In an embodiment, every two neighboring/adjacent IC dies 102 are spaced or separated from each other with a first lateral distance d1. Lateral may refer to a dimension/measurement along the X-axis. In an embodiment, the rewiring substrate 107 may be prefabricated. Corresponding to each individual IC die 102, the prefabricated rewiring substrate 107 may comprise a plurality of interlayer dielectric layers (e.g. a first interlayer dielectric layer 1071, a second interlayer dielectric layer 1073 etc. as described with reference to the illustration in FIG. 1) and a plurality of redistribution metal layers (e.g. a first redistribution metal layer 1072, a second redistribution metal layer 1074, a third redistribution metal layer 1076, etc. as described with reference to the illustration in FIG. 1). That is to say, for each IC die 102, a plurality of interlayer dielectric layers and a plurality of redistribution metal layers may have been prefabricated in the rewiring substrate 107. Although in the exemplary cross sectional view of FIG. 2G, detailed structure of the rewiring substrate 107 are not illustrated out, one of ordinary skill in the art should understand that the structure may be understood with reference to the illustration in FIG. 1.

In accordance with an embodiment of the present invention, the above mentioned steps S6 and S7 may be completed with standard pick-up and place equipment such as flip chip welders (e.g. datacom8800 or ESEC2100, etc.).

Figure 2H:
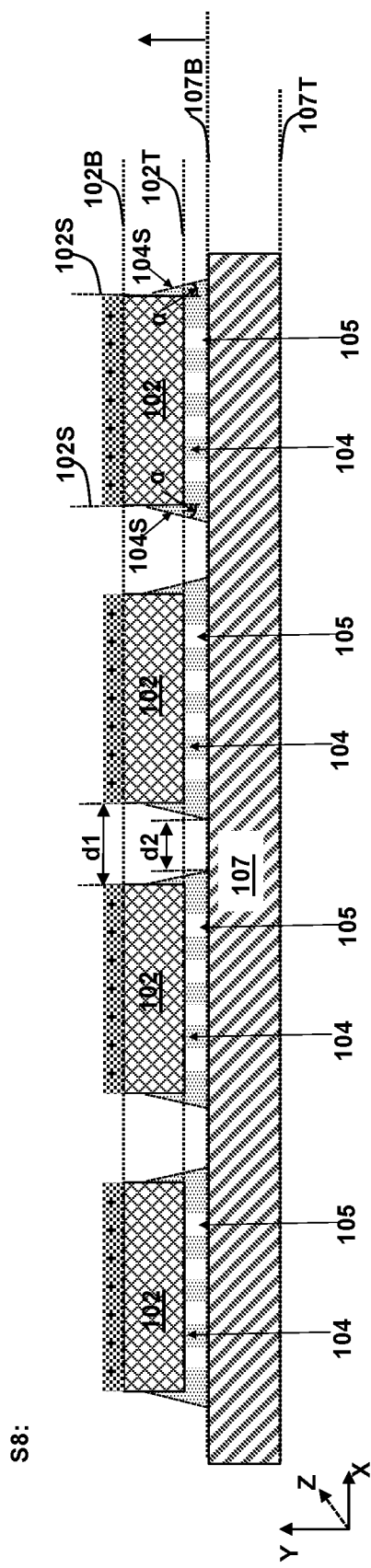

Next, referring to the illustration of FIG. 2H, in step S8, an under-fill material (or a bottom filling material) may be applied (e.g. by injection) to fill gaps between the first surface 102T of each IC die 102 and the second surface 107B of the rewiring substrate 107 to form an under fill material 104 for each IC die 102. In one embodiment, the under-fill material 104 may only fill the gaps between the plurality of metal pillars (e.g., copper columns) 105 (including corresponding solder pastes) on the first surface 102T of each IC die 102 to protect the plurality of metal pillars 105. In one embodiment, during injection of the under-fill material 104, the under-fill material 104 may further climb vertically up to cover/surround a portion of the sidewalls 102S of each IC die 102. Vertically refers to the direction parallel to the Y-axis. In one embodiment, the under-fill material 104 protrudes outward in a ladder shape from each sidewall 102S of each IC die 102, and a side surface 104S of the under-fill material 104 intersects with each sidewall 102S of each IC die 102 to form an angle α. In one embodiment, the angle α may be greater than 0 degrees and smaller than 90 degrees. In one embodiment, the angle α may be greater than 0 degrees and smaller than 45 degrees. In one embodiment, the angle α may be greater than 0 degrees and smaller than or equal to 30 degrees. FIG. 2H illustrates the angle α for one of the IC dies 102 as an example. In one example, each IC die 102 has a second lateral distance d2 between its under-fill material 104 and the under-fill material 104 of an adjacent IC die 102. That is to say, there is the second lateral distance d2 between the under-fill materials 104 of every two adjacent IC dies 102. The second lateral distance d2 is smaller than the first lateral distance d1. The second lateral distance d2 is the shortest distance between two adjacent under-fill materials 104 of every two adjacent IC dies 102 measured parallel to the X-axis direction. In one embodiment, the second lateral distance d2 is greater than 200 μm and smaller than or equal to 5000 μm. In one embodiment, the second lateral distance d2 is greater than 200 μm and smaller than or equal to 3000 μm. In one embodiment, the second lateral distance d2 is greater than 200 μm and smaller than or equal to 1000 μm. In one embodiment, a difference between the first lateral distance d1 and the second lateral distance d2, i.e. (d1−d2), is greater than 200 μm and smaller than or equal to 1000 μm.

Figure 2I:
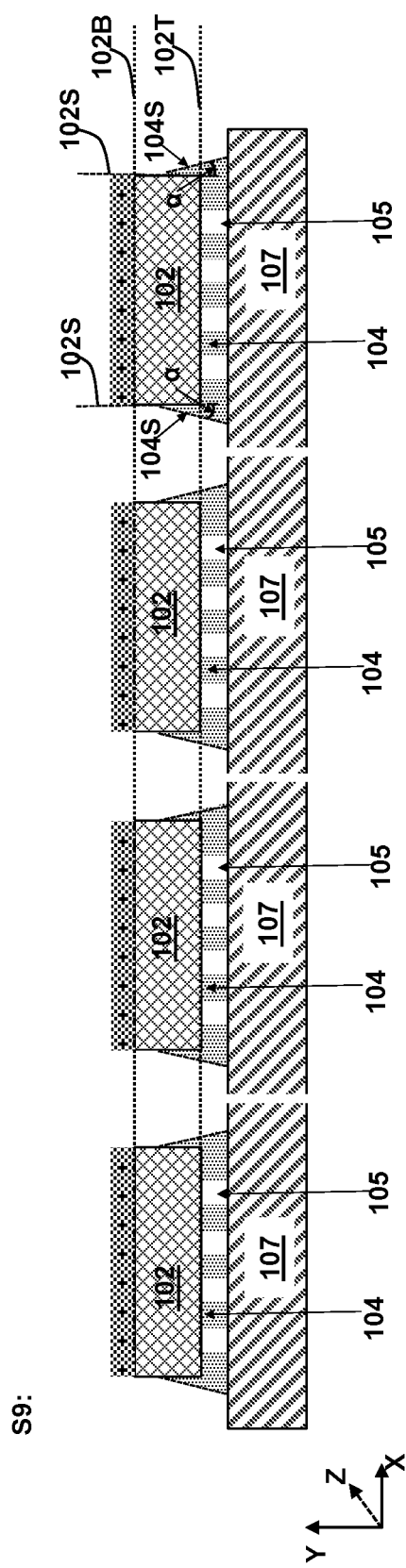

Next, referring to the illustration of FIG. 2I, in step S9, the packaging structure illustrated in FIG. 2H is divided/singulated into a plurality of independent flip chip package units 100 by for example a cutting process. Each flip chip package unit 100 may include at least one IC die 102, and a more detailed description of the structure may be found in the descriptions above with reference to the embodiments shown in FIG. 1. Those of ordinary skill in the art should understand that other process steps may also be included between the above steps S1-S9 as required by the production process, and may not be addressed in more detail to avoid obscuring aspects of embodiments of the present invention.

The present disclosure provides a flip chip package unit and associated wafer level packaging method. Although some of the embodiments of the present disclosure are described in detail, it should be understood that these implementations are for illustrative purposes only and are not intended to limit the scope of the present invention.

Other possible alternative implementations may be made by those of ordinary skill in the art by reading this disclosure. Many of the elements of one embodiment may be combined with other embodiments in addition to or in lieu of the elements of the other embodiments. Accordingly, the present invention is not limited except as by the appended claims.

What is claimed is:

1. A flip chip package unit, comprising:
an integrated circuit ("IC") die, having a first die surface and a second die surface opposite to the first die surface, and a plurality of metal pillars formed on the first die surface;
a rewiring substrate, having a first substrate surface and a second substrate surface opposite to the first substrate surface, wherein the IC die is attached to the rewiring substrate with the first die surface facing to the second substrate surface;
an under-fill material, filling gaps between the first die surface and the rewiring substrate; and
a back protective film, attached to the second die surface of the IC die, the back protective film comprising one or more adhesive films, and wherein the back protective film has a thickness of no thicker than 100 μm.

2. The flip chip package unit of claim 1, wherein the back protective film has a ductility/extensibility identical to that of Au, or Ag, or Al, or Cu.

3. The flip chip package unit of claim 1, wherein the back protective film has a viscosity in a range from 100 Pa·s to 3000 Pa·s at 25 degree centigrade, and a UV sensitivity which refers to change in characteristics of the back protective film before and after UV irradiation, and wherein said change in characteristics at least includes that the back protective film changes from non-solid before UV irradiation to solid after UV irradiation while its viscosity with the IC die is not reduced.

4. The flip chip package unit of claim 1, wherein the back protective film has a coefficient of thermal expansion ("CTE"), a shrinkage rate, and an elastic modulus matching with those of materials of the second die surface of the IC die.

5. The flip chip package unit of claim 1, wherein the CTE is in a range of 5-200, and wherein the shrinkage rate is in a range of 0.1%-0.6%.

6. The flip chip unit of claim 1, wherein the back protective film has a non-hygroscopic property and its moisture sensitivity is of level I.

7. The flip chip package unit of claim 1, wherein the back protective film has a thickness in a range from 25 μm to 80 μm.

8. The flip chip package unit of claim 1, wherein the back protective film has a thermal conductivity in a range from 0.5 W/(m·K) to 10 W/(m·K).

9. The flip chip package unit of claim 1, wherein the under-fill material further vertically climbs up to cover/surround a portion of sidewalls of the IC die.

10. The flip chip package unit of claim 1, wherein the under-fill material protrudes outwards in a ladder shape from each sidewall of the IC die and a side surface of the under-fill material intersects with each sidewall of the IC die to form an angle.

11. The flip chip package unit of claim 10, wherein the angle is in a range greater than 0 degrees and smaller than 45 degrees.

12. The flip chip package unit of claim 10, wherein the angle is in a range greater than 0 degrees and smaller than or equal to 30 degrees.

* * * * *